(12) United States Patent
Liu et al.

(10) Patent No.: US 6,919,607 B2
(45) Date of Patent: Jul. 19, 2005

(54) STRUCTURE OF TWO-BIT MASK READ-ONLY MEMORY DEVICE AND FABRICATING METHOD THEREOF

(75) Inventors: Mu-Yi Liu, Taichung (TW); Kwang-Yang Chan, Hsinchu (TW); Yen-Hung Yeh, Taoyuan Hsien (TW); Tso-Hung Fan, Taipei Hsien (TW); Tao-Cheng Lu, Kaoshiung (TW)

(73) Assignee: MACRONIX International Co., Ltd., Hsinchu (TW)

( * ) Notice: Subject to any disclaimer, the term of this patent is extended or adjusted under 35 U.S.C. 154(b) by 62 days.

(21) Appl. No.: 10/142,697

(22) Filed: May 8, 2002

(65) Prior Publication Data

US 2003/0205764 A1 Nov. 6, 2003

(30) Foreign Application Priority Data

May 2, 2002 (TW) ...................................... 91109120 A

(51) Int. Cl.⁷ ............................................... H01L 29/78
(52) U.S. Cl. ........................ 257/390; 257/391; 438/276
(58) Field of Search ................................ 257/390, 391; 438/276, 278

(56) References Cited

U.S. PATENT DOCUMENTS

| | | | | | |
|---|---|---|---|---|---|
| 5,200,802 A | * | 4/1993 | Miller | .......................... | 257/390 |
| 5,401,994 A | * | 3/1995 | Adan | .......................... | 257/335 |
| 5,407,852 A | * | 4/1995 | Ghio et al. | .................. | 438/130 |
| 5,422,505 A | * | 6/1995 | Shirai | .......................... | 257/327 |
| 5,432,103 A | * | 7/1995 | Miller | .......................... | 438/278 |
| 5,512,507 A | * | 4/1996 | Yang et al. | .................. | 438/598 |
| 5,538,914 A | * | 7/1996 | Chiu et al. | .................. | 438/275 |
| 5,600,171 A | * | 2/1997 | Makihara et al. | ........... | 257/390 |
| 5,633,187 A | * | 5/1997 | Hsu | .......................... | 438/275 |
| 5,661,326 A | * | 8/1997 | Hong | .......................... | 257/402 |
| 5,759,901 A | * | 6/1998 | Loh et al. | .................. | 438/305 |
| 5,985,723 A | * | 11/1999 | Hsu | .......................... | 438/278 |
| 6,025,232 A | * | 2/2000 | Wu et al. | .................. | 438/270 |
| 6,133,101 A | * | 10/2000 | Wu | .......................... | 438/276 |
| 6,190,980 B1 | * | 2/2001 | Yu et al. | .................. | 438/302 |
| 6,344,993 B1 | * | 2/2002 | Harari et al. | .......... | 365/185.01 |
| 6,570,214 B1 | * | 5/2003 | Wu | .......................... | 257/315 |

* cited by examiner

*Primary Examiner*—Tom Thomas
*Assistant Examiner*—Eugene Lee
(74) *Attorney, Agent, or Firm*—J.C. Patents

(57) ABSTRACT

A structure of a 2-bit mask ROM device and a fabrication method thereof are provided. The memory structure includes a substrate, a gate structure, a 2-bit coding implantation region, a spacer, a buried drain region, an isolation structure and a word line. The gate structure is disposed on the substrate, while the coding implantation region is located in the substrate under the side of the gate structure. Further, at least one spacer is arranged beside the side of the gate structure and a buried drain region is disposed in the substrate beside the side of the spacer. Moreover, the buried drain region and the coding implantation region further comprise a buffer region in between. Additionally, an insulation structure is arranged on the substrate that is above the buried drain region, while the word lien is disposed on the gate structure.

11 Claims, 5 Drawing Sheets

STRUCTURE OF TWO-BIT MASK READ-ONLY MEMORY DEVICE AND FABRICATING METHOD THEREOF

CROSS-REFERENCE TO RELATED APPLICATION

This application claims the priority benefit of Taiwan application serial no. 91109120, filed May 2, 2002.

BACKGROUND OF THE INVENTION

1. Field of the Invention

The present invention relates to a structure of a memory device and a fabrication method thereof. More particularly, the present invention relates to a two-bit mask read-only memory (ROM) device and the fabricating method thereof.

2. Background of the Invention

Mask ROM device is a very fundamental type of read-only memory devices, in which a photomask layer is used to define a connection between a metal line and a memory cell or an ion implantation process is used to adjust the threshold voltage to achieve the "on" and "off" of the memory cell. When there are changes in the product of a mask ROM device, no dramatic modification is demanded by the manufacturing process. Only one set of photomask needs to be changed. Therefore, the manufacturing of a mask ROM device is suitable for mass production. Actually, a portion of the manufacturing process can be completed first. The programming of the device can be quickly performed soon after an order is placed to move up the delivery/shipping date.

Currently a two-bit memory cell is being aggressively developed. A two-bit memory cell apparently implies two bits of data are stored in a single memory cell. The structure of this type of memory device is summarized below.

FIG. 1 is a schematic diagram illustrating a cross-sectional view of 2-bit mask ROM device.

Referring to FIG. 1, a conventional 2-bit mask ROM device includes a substrate 100, a gate structure 106, a 2-bit coding implantation region 110, a buried drain region 108, an insulation structure 112 and a word line 114.

The gate structure 106 is arranged on the substrate 100, wherein the gate structure 106 includes a gate conductive layer 104 and an underlying gate oxide layer 102. Further, the buried drain region 108 is disposed beside both sides of the gate structure 106 in the substrate 100 to serve as a bit line.

Moreover, the 2-bit coding implantation region 110 is located beside the side of the gate structure 106 in the substrate 100. A memory cell with the presence of the coding ions implanted in the 2-bit coding implantation region 110 corresponds to a logic state of "1", while in the absence of coding ions implanted in the 2-bit coding implantation region 110 corresponds to a logic state of "0".

The insulation structure 112 is disposed on the substrate 100 that is above the buried drain region 108 to isolate the neighboring gate structures 106. Further, a word line 114 is formed on the surface of the gate structures 106 to electrically connect the gate structures 106 along the same row.

Since the dopant concentration in the buried drain region of the conventional a 2-bit mask ROM device is very high, the neighboring memory cells are easily be interfered by the 2-bit mask ROM device. Further, the junction of the buried drain region of a conventional 2-bit mask ROM is connected with the 2-bit coding implantation region, a junction leakage thus easily occurs. Since during the operation of the conventional 2-bit mask ROM device, the neighboring memory cells are easily be interfered and a junction leakage easily occurs, the operation window of a conventional 2-bit mask ROM is smaller.

SUMMARY OF THE INVENTION

The present invention provides a structure of a 2-bit mask ROM device and a fabrication method thereof, wherein the neighboring memory cells being interfered by the 2-bit memory cell is obviated.

The present invention also provides a 2-bit mask ROM device and a fabrication method thereof, wherein a junction leakage can be prevented.

The present invention further provides a 2-bit mask ROM device, wherein the operation window of the memory device is increased.

The present invention provides a 2-bit mask ROM device, the memory device comprises a substrate, a gate structure, a 2-bit coding implantation region, at least one spacer, a buried drain region, an isolation structure and a word line. The gate structure is disposed on the substrate, wherein the gate structure comprises a gate conductive layer and a gate oxide layer. The 2-bit coding implantation region is located in the substrate beside the sides of the gate structure. Further, the spacer is disposed beside the sides of the gate structure, while the buried drain region is located in the substrate beside the gate structure, serving as a bit line. Additionally, the buried drain region and the 2-bit coding implantation region further comprises a buffer region in between. The insulation structure is located on the surface of the substrate above the buried drain region and the word line is located on the surface of the gate structure, wherein the word line comprises a polysilicon layer and a metal silicide layer on the polysilicon layer. The spacer and the insulation structure may be formed by the same or different material.

According to the fabrication method for a 2-bit mask ROM device of the present invention, wherein a gate structure is formed on a substrate. The gate structure includes a gate conductive layer and a gate oxide layer formed underneath the gate conductive layer. Thereafter, a patterned photoresist layer is formed on the substrate, exposing the 2-bit coding implantation region. Using the patterned photoresist layer as a mask, a 2-bit coding implantation is conducted. The patterned photoresist layer is then removed. At least one spacer is then formed on the side of the gate structure. Thereafter, an ion implantation process is conducted to form a buried drain region in the substrate beside the side of the spacer, using the gate structure and the spacer as an implantation mask. A plurality of 2-bit coding memory cells is thus formed, wherein the 2-bit coding memory cell with the presence of coding ions implanted therein corresponds to a logic state of "1", while in the absence of the coding ions corresponds to a logic state of "0". Subsequently, an insulation structure is formed on the surface of the substrate above the buried drain region, followed by forming a word line on the gate structure.

According to the 2-bit mask ROM device of the present invention, the dopant concentrations in the 2-bit coding implantation region is lower. Interference generated between the 2 bit memory cells is thus mitigated.

According to the 2-bit mask ROM device of the present invention, the buried drain region and the 2-bit coding implantation region further comprise a buffer region therebetween. Therefore, the buried drain region and the 2-bit coding implantation region are thereby not connected with each other to prevent a junction leakage.

According to the 2-bit mask ROM device of the present invention, the operation window of the memory device is increased because the 2-bit memory cells of the present invention do not mutually interfered and a junction leakage is prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 2A to 2G are schematic cross-sectional views illustrating the fabrication method of a 2-bit mask ROM according to one embodiment of the present invention.

Figure 1:
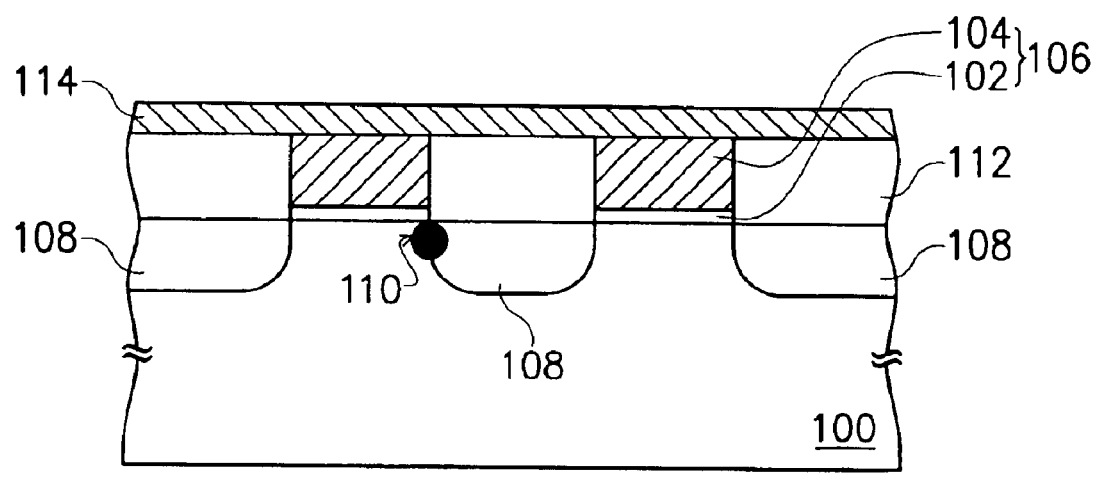
FIG. 1 is a schematic, cross-sectional view illustrating the conventional 2-bit mask ROM device.
Figure 2A:
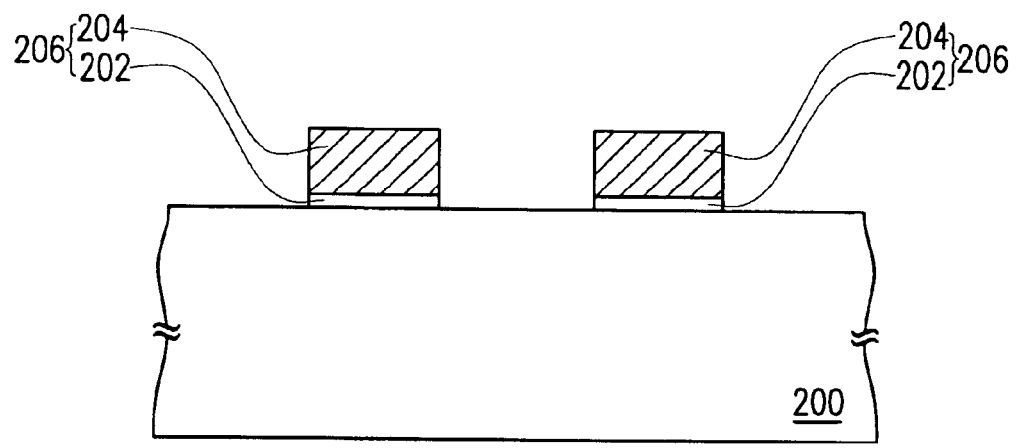
FIGS. 2A to 2G are schematic cross-sectional views illustrating the fabrication method of a 2-bit mask ROM according to one embodiment of the present invention.

Referring to FIG. 2A, a gate structure 206 is formed on a P-type substrate 200, wherein the gate structure 206 includes a gate conductive layer 204 and a gate oxide layer 202 underneath the gate conductive layer 204. The gate conductive layer 204 includes, for example, polysilicon.

Figure 2B:
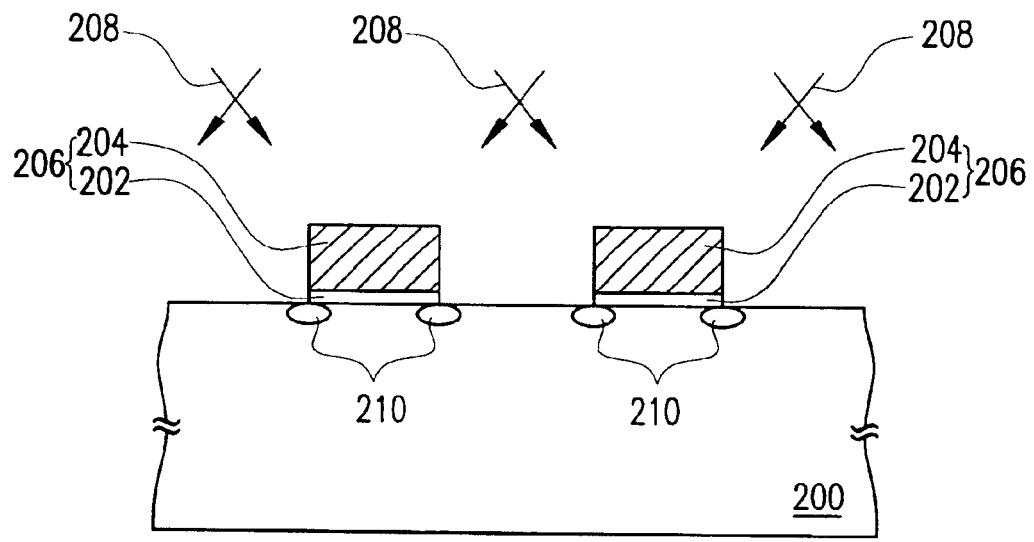

After this, as shown in FIG. 2B, a pocket ion implantation process 208 is performed to form a pocket doped region 210, wherein the pocket doped region 210 is implanted with dopants, such as, boron ions. The dopant concentration for the pocket ion implantation process is about $4 \times 10^{12}/cm^2$. The implantation energy for the implantation process 208 is about 50 KeV. Further, the implantation angle for the pocket ion implantation process is about 30 degrees.

Figure 2C:
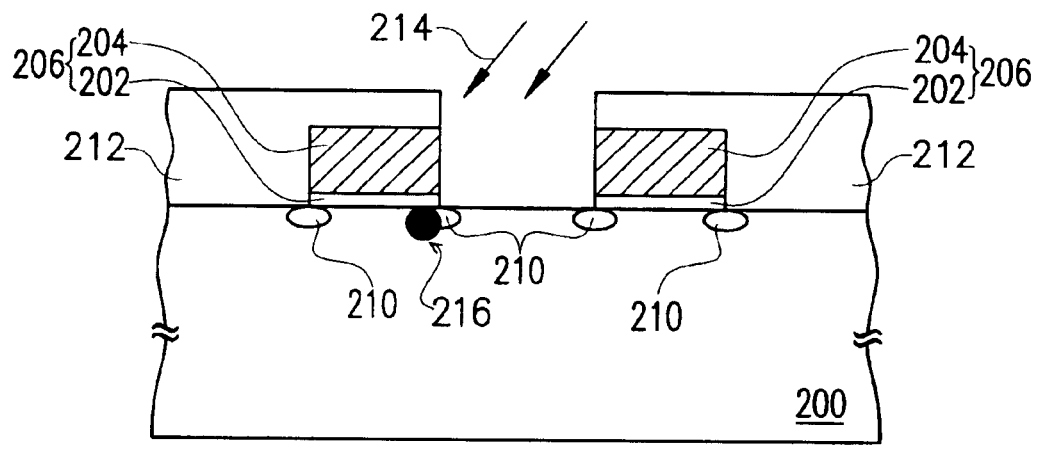

Continuing to FIG. 2C, a patterned photoresist layer 212 is formed on the substrate 200, exposing a 2-bit coding implantation region 216. A 2-bit coding implantation process 214 is then conducted using the photoresist layer 212 as a mask. The dopants implanted for the 2-bit coding implantation region include boron ions. The dopant concentration for the 2-bit coding implantation process 214 is about $1 \times 10^{13}/cm^2$. The implantation energy for the implantation process 214 is about 25 KeV. Further, the implantation angle for the 2-bit coding implantation process 214 is about 30 degrees.

Figure 2D:
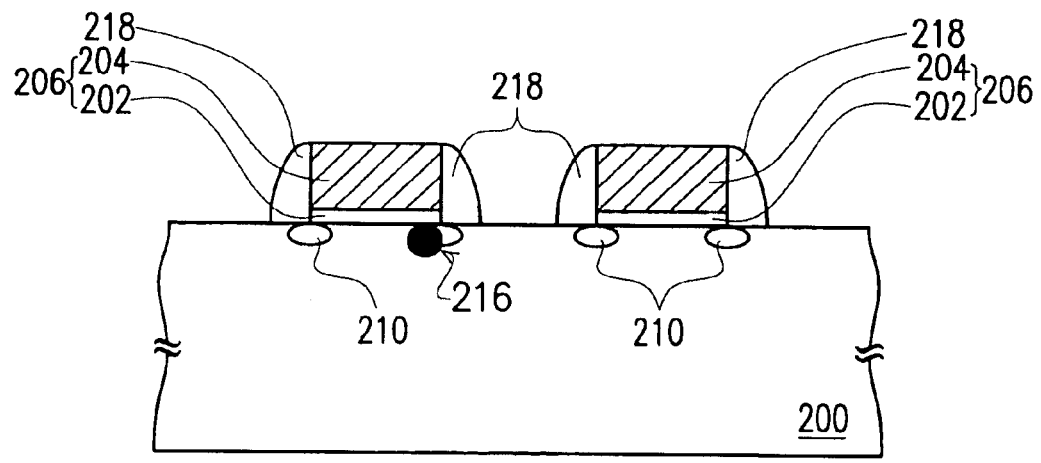

Further, as shown in FIG. 2D, the photoresist layer 212 is removed. A spacer 218 is then formed on the side of the gate structure 206, wherein the spacer 218 is about 400 angstroms to 600 angstroms thick, and preferably about 500 angstroms. The spacer 218 can be silicon nitride or silicon oxide type of material. Moreover, the spacer 218 is formed by, for example, forming a conformal dielectric layer on the substrate 200, followed by etching back the conformal dielectric layer to form the spacer 218.

Figure 2E:
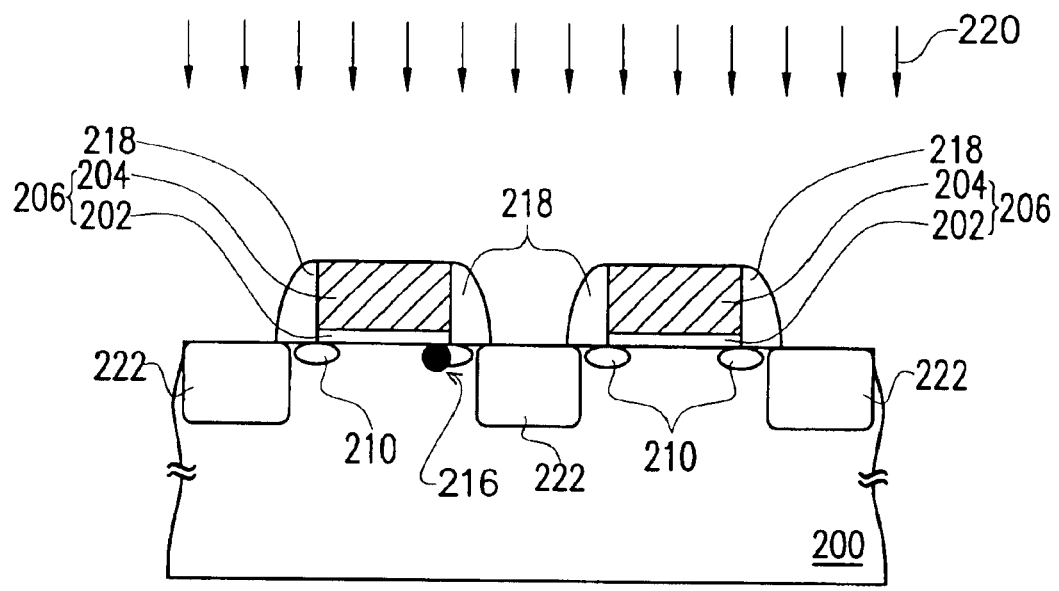

Continuing to FIG. 2E, using the spacer 218 and the gate structure 206 as implantation mask, an ion implantation process 220 is performed to form a buried drain region 222 in the substrate 200 beside the spacer 218. A plurality of 2 bit-coding memory cells is thus formed. The dopants implanted for the buried drain region 222 includes arsenic ions. The dopant concentration implanted for the ion implantation process 220 is about $1.5 \times 10^5/cm^2$. The implantation energy for the ion implantation process 220 is about 20 keV. Further, each 2-bit coding memory cell that has a coding implantation present in the 2 bit coding implantation region corresponds to a logic state of "1", while in the absence of the coding implantation in the 2-bit coding implantation region corresponds to a logic state of "0".

Since a spacer 218 is formed on the side of the gate structure 206, the junction between the buried drain region 222 and the 2-bit coding implantation region 216 are not connected. In other words, the buried drain region 222 and the 2-bit coding implantation region 216 further comprise a buffer region in between. The buffer region includes the previously formed pocket doped region 210. As a result, junction leakage that easily occurs in the prior art due to a connection between the buried drain region and the 2-bit coding implantation is prevented. Further, the dopant concentrations in the 2-bit coding implantation region 216 and the pocket type doped region 210 are lower. Therefore, mutual interference between the 2-bit memory cells can be prevented.

Figure 2F:
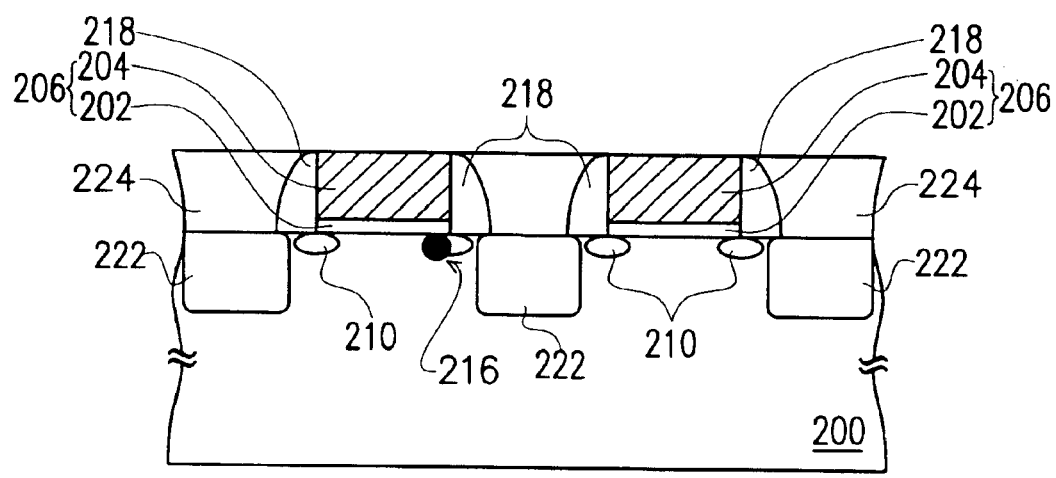

After this, referring to FIG. 2F, an insulation structure 224 is formed on the substrate 200 surface that is above the buried drain region 222. The insulation structure 224 is used to isolate the neighboring gate structures 206, wherein the insulation structure 224 includes TEOS (tetra-ethyl-orthosilicate)-silicon oxide. Moreover, the insulation structure 224 is formed by forming an insulation layer on the substrate 200 to cover the gate structure 206, followed by chemical mechanical polishing or etching back a portion of the insulation layer until the surface of the gate structure 206 is exposed.

Figure 2G:
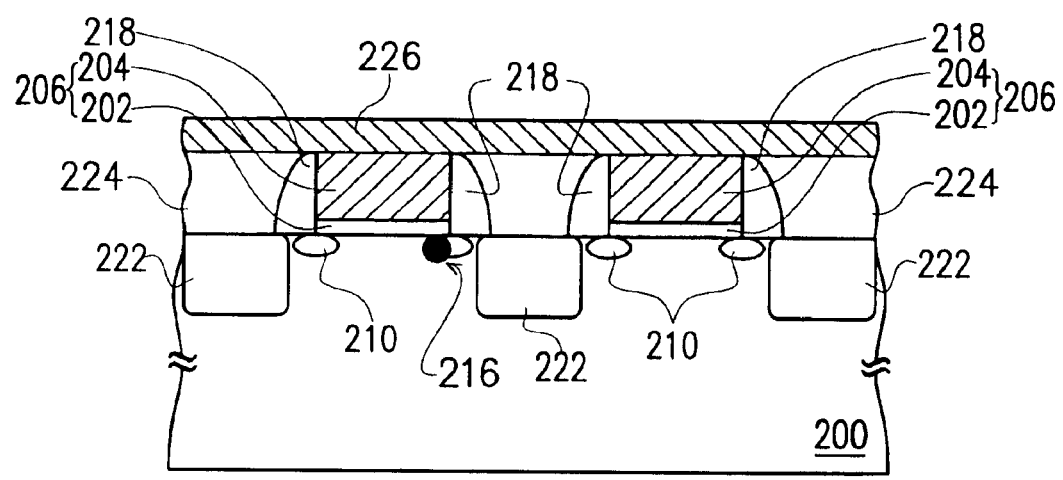

Continuing to FIG. 2G, a word line 226 is formed on the surface of the gate structure 206 to electrically connect the gate structures 206 along a same row. The word line 226 is formed with a material that includes polysilicon. Moreover, the polysilicon word line 226 further comprises a metal silicide layer to lower the resistance of the word line 226. The fabrication method for a 2-bit mask ROM device is thereby completed.

According to the 2-bit mask ROM device of the present invention, the dopant concentrations in the 2-bit coding implantation region and in the pocket type of doped region are lower. Interference generated between the 2-bit memory cells is thus mitigated.

According to the 2-bit mask ROM device of the present invention, the buried drain region and the 2-bit coding implantation region further comprises a buffer region in between. Junction leakage is thus prevented because the buried drain region and the 2-bit coding implantation region are not connected.

According to the 2-bit mask ROM device of the present invention, the operation window of the memory device is increased because the 2-bit memory cells of the present invention will not be mutually interfered and junction leakage is prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A 2-bit mask ROM device, comprising:

a substrate;

a gate structure disposed on the substrate;

a coding region, located in the substrate beside a side of the gate structure, wherein presence or absence of dopants in the coding region determines "1" state or "0" state respectively;

at least one spacer disposed on a sidewall of the gate structure;

a buried drain region located in the substrate beside a side of the spacer, wherein the buried drain region and the coding region further comprises a buffer region in between, wherein dopant type of the buffer region and dopant type of the coding region are the same, and the buffer region has a dopant concentration lower than that of the coding region;

an insulation structure, positioned on the substrate above the buried drain region; and a word line, disposed on a surface of the gate structure.

2. The device of claim 1, wherein the spacer is about 400 angstroms to about 600 angstroms thick.

3. The device of claim 1, wherein the device further comprises a packet doped region located in the buffer region.

4. The device of claim 3, wherein the pocket doped region includes boron ions implanted at a dopant concentration of about $4 \times 10^{12}/cm^2$.

5. The device of claim 1, wherein the coding region includes boron ions implanted at a dopant concentration of about $1.5 \times 10^{13}/cm^2$.

6. The device of claim 1, wherein the buried drain region includes arsenic ions implanted at a dopant concentration of about $1.5 \times 10^{15}/cm^2$.

7. The device of claim 1, wherein a material of the spacer and the insulation structure is same.

8. The device of claim 1, wherein a material of the spacer and the insulation structure is different.

9. The device of claim 1, wherein the gate structure includes a polysilicon layer and a gate oxide layer under the polysilicon layer.

10. The device of claim 1, wherein the word line includes a polysilicon layer and a metal suicide on the polysilicon layer.

11. The device of claim 1, wherein the buffer region is disposed underneath the spacer.

* * * * *